United States Patent [19]
Chen

[11] Patent Number: 6,087,695
[45] Date of Patent: Jul. 11, 2000

[54] SOURCE SIDE INJECTION FLASH EEPROM MEMORY CELL WITH DIELECTRIC PILLAR AND OPERATION

[75] Inventor: Chih Ming Chen, Hsinchu, Taiwan

[73] Assignee: Worldwide Semiconductor MFG, Hsinchu, Taiwan

[21] Appl. No.: 09/378,271

[22] Filed: Aug. 20, 1999

[51] Int. Cl.$^7$ .................................................. H01L 29/788
[52] U.S. Cl. ......................... 257/314; 257/295; 257/298; 257/314; 257/315; 257/316; 257/326
[58] Field of Search .................................. 257/295, 398, 257/314, 315, 316, 326

[56] References Cited

U.S. PATENT DOCUMENTS

| | | | |
|---|---|---|---|
| 5,241,499 | 8/1993 | Camerlenghi | 365/189 |
| 5,267,195 | 11/1993 | Kodama | 365/185 |
| 5,273,923 | 12/1993 | Chang et al. | 437/43 |
| 5,596,523 | 1/1997 | Endoh et al. | 365/182 |
| 5,606,521 | 2/1997 | Kuo et al. | 365/149 |
| 5,619,052 | 4/1997 | Chang et al. | 257/321 |
| 5,811,852 | 9/1998 | Ling | 257/315 |
| 5,828,099 | 10/1998 | Van Dorf et al. | 257/314 |
| 5,976,926 | 11/1999 | Wu et al. | 438/237 |
| 5,981,993 | 11/1999 | Cho | 257/311 |

FOREIGN PATENT DOCUMENTS

| | | | |
|---|---|---|---|
| 406132540 | 5/1994 | Japan | 257/315 |
| 406151780 | 5/1994 | Japan | 257/315 |
| 406151785 | 5/1994 | Japan | 257/315 |
| 406163921 | 6/1994 | Japan | 257/315 |

*Primary Examiner*—David Hardy
*Assistant Examiner*—Edgardo Ortiz
*Attorney, Agent, or Firm*—Blakely, Sokoloff, Taylor & Zafman

[57] ABSTRACT

A semiconductor flash memory cell. A p-well is formed in a semiconductor substrate. A thin oxide layer is formed over the p-well and semiconductor substrate. A dielectric pillar extending up from the semiconductor substrate is formed to support a control gate. A select gate is formed that extends underneath the control gate to be between the control gate and the thin oxide layer. Next, a floating gate is formed to extend underneath the control gate to be between the control gate and the thin oxide layer. A source region is formed in the p-well to be adjacent to the floating gate. Finally, a drain is formed in the p-well, the drain formed adjacent to the select gate.

9 Claims, 2 Drawing Sheets

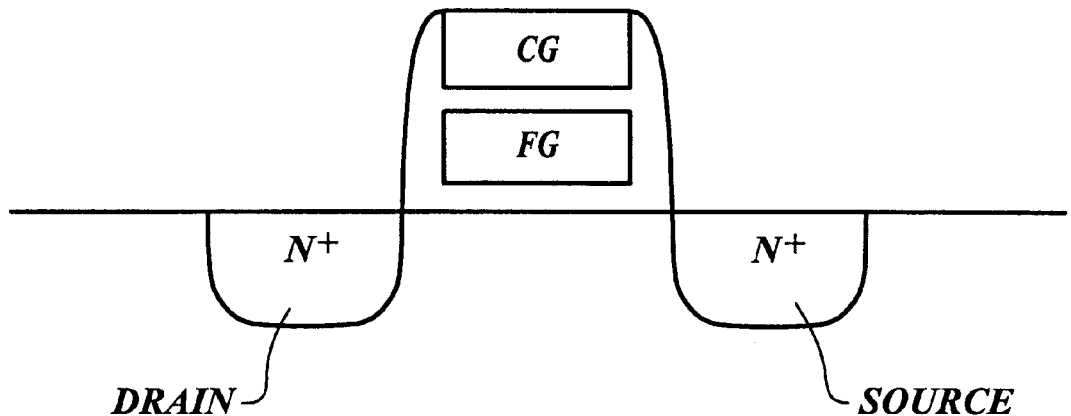
Fig. 1 *(PRIOR ART)*
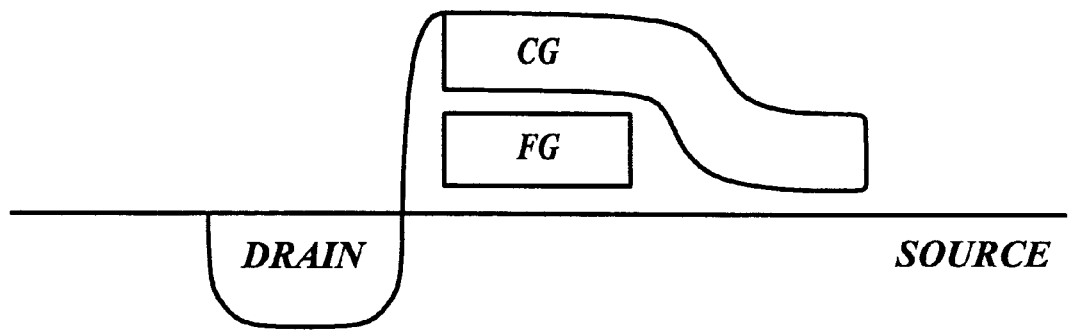
Fig. 2 *(PRIOR ART)*

6,087,695

SOURCE SIDE INJECTION FLASH EEPROM MEMORY CELL WITH DIELECTRIC PILLAR AND OPERATION

FIELD OF THE INVENTION

This invention relates to semiconductor flash memory, and more particularly, to a flash memory cell using source side injection.

BACKGROUND OF THE INVENTION

Toward the end of the 1980s, the semiconductor industry developed the electrically erasable PROM (EEPROM). The result was a new generation of memories targeted at the low cost, high density memory market. The term "flash" historically had been used to describe a mode of programming or erasing an entire memory array at one time. The flash memory is programmed by hot electron injection at the drain edge and erased by Fowler-Nordheim tunneling from the floating gate to the source.

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero".

Many flash memory manufacturers chose a thin oxide floating gate process to make an electrically erasable PROM. As seen in FIG. 1, the basic cell consists of access transistors and a double polysilicon storage cell with a floating polysilicon gate (FG) isolated in silicon dioxide capacitively coupled to a second polysilicon control gate (CG) which is stacked above it. The storage transistor is programmed by Fowler-Nordheim tunneling of electrons through a thin oxide layer between the gate and the drain of the transistor. The thin tunneling oxide generally is about 90 angstroms thick. One difficulty with this structure is that the memory cell may be erased to a negative threshold voltage and the channel between the drain and source will conduct leakage current even when the control gate (CG) is grounded. Furthermore, the prior art memory cell requires a programming current of 400 microamps to 1 milliamp per cell. In practical applications, this requires a very large charge pump to supply enough current.

Another prior art design known as the split gate flash cell is shown in FIG. 2. The split gate cell eliminates over erase sensitivity because even if the floating gate (FG) is over erased, conduction in the channel requires the biasing of the control gate which is over another portion of the channel between the source and drain. One disadvantage of this design is that the cell size is increased and the manufacture of the cell suffers from alignment sensitivity.

Yet another type of split gate cell utilizes the so-called source-side injection technique which minimizes the channel current during programming and an on-chip pump circuit can be used to provide adequate programming current by using a single power supply. However, there are still several drawbacks in this design. First, the misalignment from the poly1 (the floating gate) and poly2 (the control gate) layers will always make the cell current asymmetric. In addition, this design results in easy punchthrough and the cell dimension is hard to scale down in size. Second, the erase mechanism will induce electron trapping and reduce endurance performance.

U.S. Pat. No. 5,614,746 to Hong et al., U.S. Pat. No. 5,674,767 to Lee et al., U.S. Pat. No. 5,789,296 to Sung et al., and the references cited therein illustrate these various prior art approaches to the split gate flash memory cell.

What is needed is a new design for a flash memory cell that overcomes the problems noted above.

SUMMARY OF THE INVENTION

A semiconductor flash memory cell is disclosed. The memory cell comprises: a p-well formed in a semiconductor substrate; a thin oxide layer over said p-well and over said semiconductor substrate; a dielectric pillar extending up from said semiconductor substrate; a control gate formed atop of said dielectric pillar; a select gate extending underneath said control gate to be between said control gate and said thin oxide layer, said select gate being electrically insulated from said control gate; a floating gate extending underneath said control gate to be between said control gate and said thin oxide layer, said floating gate electrically insulated from said control gate and said select gate; a source formed in said p-well, said source formed adjacent to said floating gate; and a drain formed in said p-well, said drain formed adjacent to said select gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a schematic of a prior art stack gate flash memory cell;

FIG. 2 is a schematic of a prior art split gate flash memory cell; and

DETAILED DESCRIPTION OF THE PREFERRED EMBODIMENT

Figure 3:
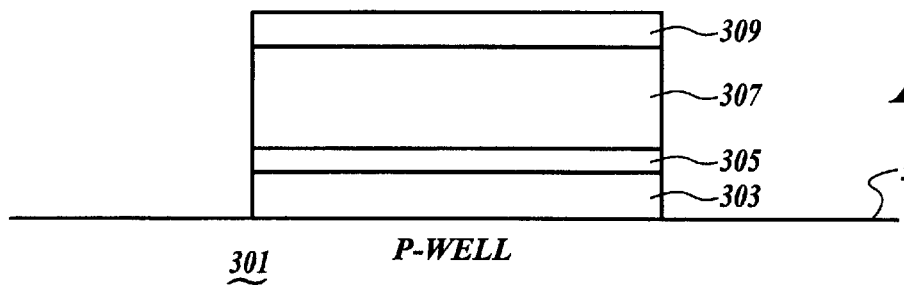
FIGS. 3–5 are cross-sectional views of a semiconductor substrate illustrating the steps in forming a flash memory cell in accordance with the present invention.

Turning to FIG. 3, a silicon substrate 300 is provided. Formed within the substrate is a p-well 301, which can be formed using conventional ion implantation technologies. Next, a series of stacked layers are formed above the p-well 301. First, a high temperature oxide (HTO) layer 303 is formed as the bottom layer in contact with the substrate 300. The HTO layer 303 preferably can be formed by thermal oxidation to a thickness of about 200–1500 angstroms. Alternatively, the HTO layer 303 may be a chemical vapor deposition (CVD) oxide that is deposited.

Formed atop of the HTO layer 303 is a first silicon nitride layer 305. The silicon nitride layer 305 can be formed using CVD to a thickness of about 50–200 angstroms. Next, an in situ doped first polysilicon layer 307 having a preferred thickness of 1500–4000 angstroms is formed on top of the first silicon nitride layer 305. Preferably, the polysilicon layer 307 is formed from a CVD process.

Finally, a second silicon nitride layer 309 is formed on top of the first polysilicon layer 307. The second silicon nitride layer 309 preferably has a thickness of 50–200 angstroms. After all of these layers have been deposited, using conventional photolithography and etching, the layers 303–309 are etched to form the stack shown in FIG. 3. Preferably, the width of the stack is on the order of 0.3 to 0.4 microns (3000–4000 angstroms).

Alternatively, additional thin HTO layers may be added to the stack. In particular, a thin HTO layer may be formed between the first nitride layer 305 and the first polysilicon layer 307. Similarly, a thin HTO layer may be formed between the fist polysilicon layer 307 and the second nitride layer 309. Finally, a thin HTO layer may be formed between the second nitride layer 309 and a second polysilicon layer 403 (described below). Preferably, the thin HTO layers are on the order of 50 to 100 angstroms thick. The purpose of the HTO layers are to form ONO dielectrics in between the first polysilicon layer 307 and the second polysilicon layer 403 to provide improved data retention performance. Note that the thin HTO layers will be little affected by a subsequent wet dipping step (described below) because the thickness of the thin HTO layers is very thin. Any removal of the thin HTO layers during the wet dip will be repaired by a subsequent thermal oxidation step (described below).

Figure 4:
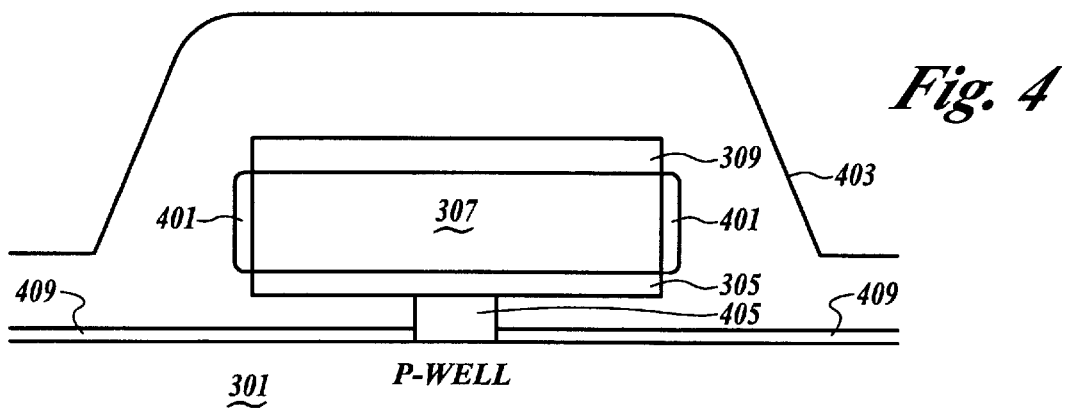

Next, turning to FIG. 4, the HTO layer 303 is etched using a wet dip (for example in a dilute HF solution). The polysilicon layer 307 and the silicon nitride layers 305 and 309 are relatively unaffected by the wet dip etch. As a result of the wet dip, the HTO layer 303 is removed laterally from the outside in. The wet dip is controlled such that a HTO pillar 405 remains underneath the stack of layers 305–309. Preferably, the HTO pillar 405 has a remaining width in the range of 300–1200 angstroms.

After the wet dip, a thermal oxidation step is performed to oxidize the sidewalls of the polysilicon layer 307. The result is insulating oxide sidewalls 401 on the sidewalls of the polysilicon layer 307. Preferably, the thickness of the oxide sidewalls 401 is on the order of 250 angstroms. The thickness will be around 200 to 300 angstroms due to the fact that the oxidation rate of polysilicon is 3 times faster than that of silicon substrate. Additionally, the thermal oxidation step also causes a thin tunnel oxide 409 to be formed on the substrate. This thin tunnel oxide 409 is preferably on the order of 90 angstroms thick.

After the oxide sidewalls 401 are formed, a second in situ doped polysilicon layer 403 is deposited over the entire structure. Importantly, the second polysilicon layer 403 extends underneath the stack structure and replaces that portion of the HTO layer 303 that was removed by the wet dip. The resulting structure is shown in FIG. 4.

Figure 5:
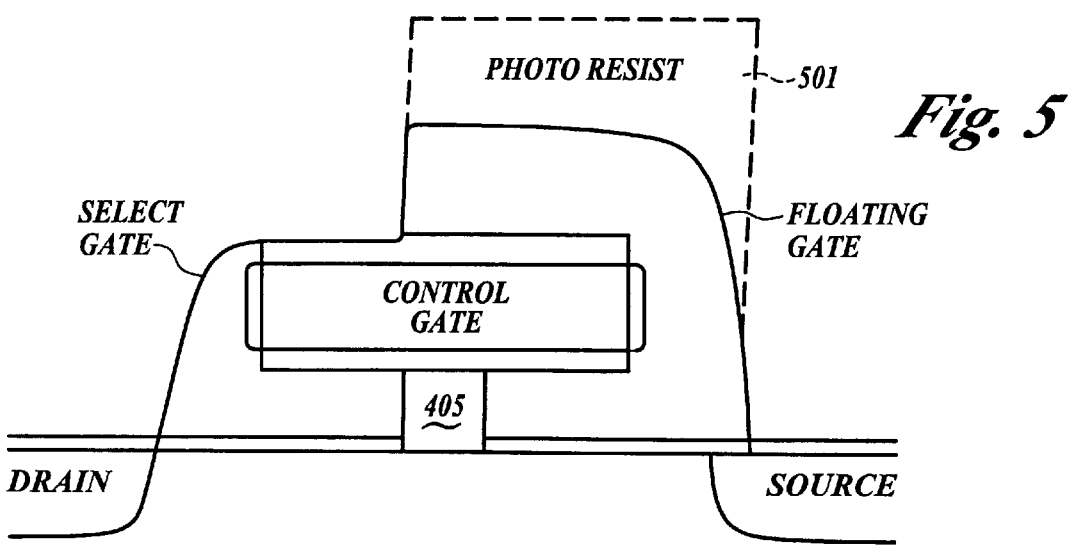

Next, turning to FIG. 5, the second polysilicon layer 403 is etched using conventional photolithography techniques. As seen in FIG. 5, the masking pattern of the photoresist 501 is such that a floating gate is left over a portion of the control gate and adjacent to a source. Further, the etching is done to form a select gate that is shaped like a sidewall spacer. Note that the select gate channel length is dependent upon the extent of the wet dip and the width of the second polysilicon spacer. Unlike the prior art, there is no alignment issue between the first and second polysilicon layers. Additionally, because the select gate wraps underneath the floating gate, there is a very good coupling coefficient during program and erase.

Finally, the drain and source regions are formed using ion implantation techniques. In particular, the source junction is formed first followed by a high temperature drive-in cycle to provide enough overlap with the floating gate and so the source junction will be deeper than the drain junction. After the drive-in cycle, the drain junction is formed using conventional masking techniques. Note particularly that amongst two adjacent flash cells, a common source (S) is formed in between them. As a final step, an interlayer dielectric (ILD) may be formed over the floating gates to ensure that they are electrically isolated from any conductive structures.

The operation of the cell of FIG. 5 is as follows:

|  | Select gate | Control Gate | Drain | Source | p-well |
|---|---|---|---|---|---|
| Program | 2.0 v | 10 v | 0 v | 6 v | 0 v |
| Erase | 0 v | −10 v | Floating | 6 v | 0 v |
| Read | 3.3 v | 2 v | 2 v | 0 v | 0 v |

This cell utilizes the source side channel hot electron mechanism to program. During programming, an approximately 6 volt difference between the source and drain is applied. Further, the select gate is turned on to about 2 volts and the control gate is biased to about 9–12 volts, and more preferably 10 volts. This will cause the channels under the select gate and the floating gate to be inverted and the 6 volt potential between the source and drain will be totally across the HTO pillar 405. The voltage from the control gate will couple to the floating gate to attract channel hot carriers to inject into the floating gate. This split gate cell uses source side injection and therefore the programming current will be around 100 nA–10 $\mu$A. This low current provides the capability of programming a large number of cells using an on-chip current pump.

The cell of the present invention uses a negative gate to source erase. During erase, about 6 volts is applied to the source and −10 volts is applied to the control gate. This will cause electrons on the floating gate to be pulled out from the floating gate and into the source through the thin oxide 409 by Fowler-Nordheim tunneling. This "negative gate source erase" provides excellent endurance performance compared to the prior art.

During the read operation, $V_{cc}$ (typically 3.3 volts in current CMOS technology) is applied to the select gate and about 2 volts on the drain. This cell provides symmetric cell current due to the use of the second polysilicon layer as the floating gate.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor flash memory cell comprising:
    a p-well formed in a semiconductor substrate;
    a thin oxide layer over said p-well and over said semiconductor substrate;
    a dielectric pillar extending up from and in contact with said semiconductor
    substrate;
    a control gate formed atop of said dielectric pillar;
    a select gate extending underneath said control gate to be between said control gate and said thin oxide layer, said select gate being electrically insulated from said control gate;
    a floating gate extending underneath said control gate to be between said control gate and said thin oxide layer, said floating gate electrically insulated from said control gate and said select gate;
    a source formed in said p-well, said source formed adjacent to said floating gate; and
    a drain formed in said p-well, said drain formed adjacent to said select gate.

2. The memory cell of claim 1 wherein said dielectric pillar is formed from oxide.

3. The memory cell of claim 1 wherein said control gate, said select gate, and said floating gate are formed from polysilicon.

4. The memory cell of claim 1 further including a first nitride layer formed atop said dielectric pillar and underneath the bottom of said control gate.

5. The memory cell of claim 1 wherein said dielectric pillar has a width of about 300–1200 angstroms.

6. The memory cell of claim 1 wherein said control gate has a width of about 3000–4000 angstroms.

7. The memory cell of claim 1 wherein said cell is erased by:

applying a voltage of about −10 volts to said control gate; and creating a voltage drop of about 6 volts from said source to said drain.

8. The memory cell of claim 1 wherein said cell is programmed by:

applying a positive voltage of about 2 volts to said select gate, applying a positive voltage of about 9–12 volts to said control gate, and creating a voltage drop of about 6 volts from said source to said drain.

9. A semiconductor flash memory cell comprising:

a p-well formed in a semiconductor substrate;

a thin oxide layer over said p-well and over said semiconductor substrate;

a dielectric pillar extending up from and in contact with said semiconductor substrate, said dielectric pillar being between 200–1500 angstroms thick;

a control gate formed atop of said dielectric pillar;

a select gate extending underneath said control gate to be between said control gate and said thin oxide layer, said select gate being electrically insulated from said control gate;

a floating gate extending vertical to and in contact with a sidewall of said dielectric pillar, said floating gate electrically insulated from said control gate and said select gate;

a source formed in said p-well, said source formed adjacent to said floating gate; and a drain formed in said p-well, said drain formed adjacent to said select gate.

* * * * *